United States Patent
Luo et al.

(10) Patent No.: US 10,580,795 B1
(45) Date of Patent: Mar. 3, 2020

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventors: Shuangqiang Luo, Boise, ID (US); Indra V. Chary, Boise, ID (US); Justin B. Dorhout, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/542,116

(22) Filed: Aug. 15, 2019

(51) Int. Cl.

| | |
|---|---|
| *H01L 27/11582* | (2017.01) |
| *H01L 27/11556* | (2017.01) |
| *H01L 23/528* | (2006.01) |
| *H01L 27/11526* | (2017.01) |
| *H01L 27/11573* | (2017.01) |
| *H01L 23/532* | (2006.01) |

(52) U.S. Cl.
CPC ...... *H01L 27/11582* (2013.01); *H01L 23/528* (2013.01); *H01L 23/53257* (2013.01); *H01L 27/11526* (2013.01); *H01L 27/11556* (2013.01); *H01L 27/11573* (2013.01)

(58) Field of Classification Search
None
See application file for complete search history.

(56) References Cited

U.S. PATENT DOCUMENTS

| | | |
|---|---|---|
| 8,624,300 B2 | 1/2014 | Tang et al. |
| 9,070,442 B2 | 6/2015 | Yip et al. |
| 9,589,978 B1 | 3/2017 | Yip |
| 9,786,375 B2 | 10/2017 | Goda et al. |
| 9,853,046 B2 | 12/2017 | Lu et al. |
| 9,905,575 B2 | 2/2018 | Lee |
| 9,941,209 B2 | 4/2018 | Tessariol et al. |
| 10,074,430 B2 | 9/2018 | Sakui |
| 10,090,318 B2 | 10/2018 | Zhu et al. |
| 10,229,923 B2 | 3/2019 | Dorhout et al. |
| 10,256,249 B2 | 4/2019 | Douhout et al. |
| 10,263,007 B2 | 4/2019 | Dorhout et al. |
| 10,269,625 B1 | 4/2019 | Matovu et al. |
| 10,283,520 B2 | 5/2019 | Hopkins et al. |
| 10,453,748 B2* | 10/2019 | Park .................. H01L 21/76897 |

(Continued)

*Primary Examiner* — J. E. Schoenholtz
(74) *Attorney, Agent, or Firm* — TraskBritt (57) ABSTRACT

A microelectronic device comprises vertically alternating conductive structures and insulating structures arranged in tiers, each of the tiers individually comprising one of the conductive structures and one of the insulating structures; a staircase structure within the stack structure and having steps comprising edges of at least some of the tiers; a source tier underlying the stack structure and comprising: a source structure, and first discrete conductive structures horizontally separated from one another and the source structure by at least one dielectric material; conductive contact structures on the steps of the staircase structure; and first conductive pillar structures horizontally alternating with the conductive contact structures and vertically extending through the stack structure to the first discrete conductive structures of the source tier. A memory device, a 3D NAND Flash memory device, and an electronic system are also described.

25 Claims, 4 Drawing Sheets

(56) References Cited

U.S. PATENT DOCUMENTS

| | | |
|---|---|---|
| 2015/0162084 A1 | 6/2015 | Morooka et al. |
| 2015/0255478 A1* | 9/2015 | Tanzawa ........... H01L 27/11526 257/314 |
| 2016/0104717 A1 | 4/2016 | Lu et al. |
| 2018/0040623 A1* | 2/2018 | Kanakamedala ............................ H01L 27/11556 |
| 2019/0103406 A1 | 4/2019 | Tang et al. |
| 2019/0280000 A1* | 9/2019 | Nakamura ........ H01L 27/11582 |

\* cited by examiner

MICROELECTRONIC DEVICES INCLUDING STAIRCASE STRUCTURES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to microelectronic devices including staircase structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional upper deck configurations have resulted in undesirable current leaks (e.g., access line to source current leaks) that can diminish desired memory device performance, reliability, and durability.

Accordingly, there remains a need for new microelectronic device (e.g., memory device, such as 3D NAND Flash memory device) configurations facilitating enhanced memory density while alleviating the problems of conventional microelectronic device configurations, as well as for new electronic systems including the new microelectronic device configurations.

DETAILED DESCRIPTION

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, "vertically-neighboring" or "longitudinally-neighboring" features (e.g., regions, structures, devices) means and includes features located most vertically proximate (e.g., vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Figure 1A:
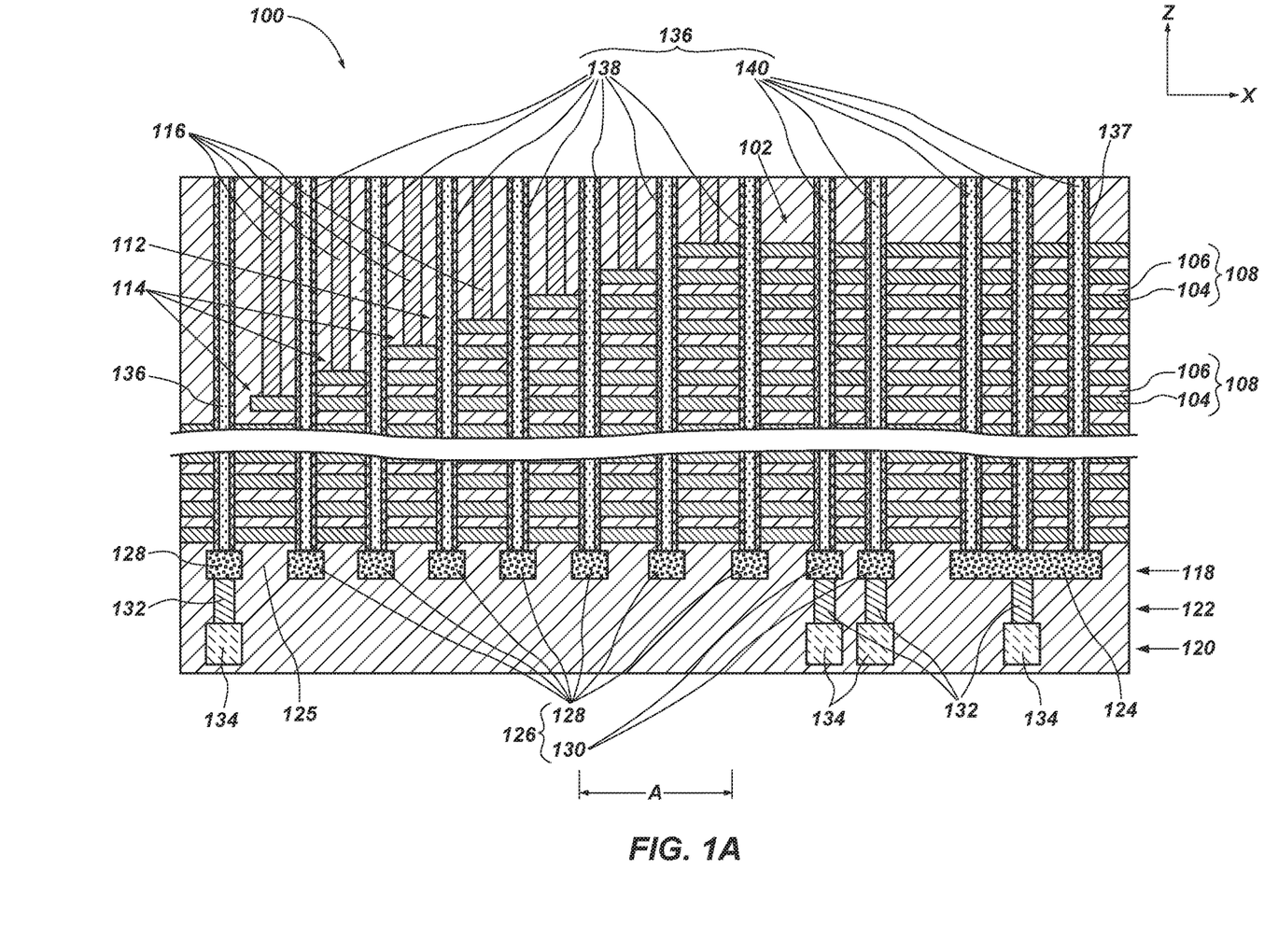
FIG. 1A is a simplified, partial cross-sectional view of a microelectronic device structure, in accordance with embodiments of the disclosure.
Figure 1B:
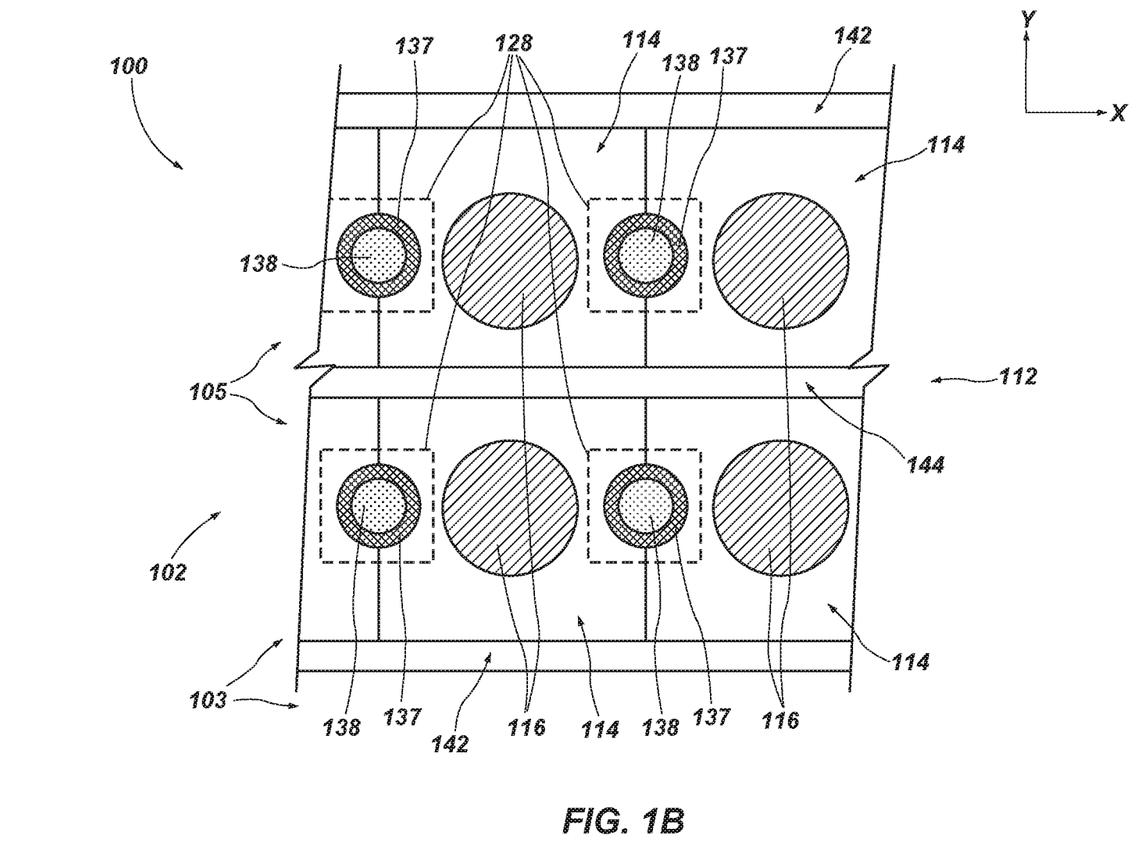
FIG. 1B is a simplified, partial top-down view of a section of the microelectronic device structure shown in FIG. 1A.

FIG. 1A is a simplified, partial cross-sectional view of a microelectronic device structure 100 of a microelectronic device (e.g., a semiconductor device; a memory device, such as a 3D NAND Flash memory device), in accordance with embodiments of the disclosure. The microelectronic device structure 100 may, for example, comprise a portion of a memory device (e.g., a multi-deck 3D NAND Flash memory device, such as a dual deck 3D NAND Flash memory device). FIG. 1B is a simplified, partial top-down view of a section A (e.g., portion, region) of the microelectronic device structure 100 shown in FIG. 1A. For clarity and ease of understanding of the drawings and related description, some vertically-lower components (e.g., features, structures, devices) of the microelectronic device structure 100 underlying relatively vertically-higher components of the microelectronic device structure 100 are depicted in FIG. 1B using dashed lines so as to provide a clearer understanding of aspects (e.g., positions, geometric configurations) of the vertically-lower components. In addition, some horizontal portions (e.g., in the X-direction and the Y-direction) of the microelectronic device structure 100 have been omitted in FIG. 1B to focus on particular aspects of the microelectronic device structure 100 in FIG. 1B.

Referring to FIG. 1A, the microelectronic device structure 100 includes a stack structure 102 including a vertically alternating (e.g., in the Z-direction) sequence of conductive structures 104 (e.g., access line plates, word line plates) and insulating structures 106 arranged in tiers 108. Each of the tiers 108 of the stack structure 102 may include at least one (1) of the conductive structures 104 vertically-neighboring at least one of the insulating structures 106. The stack structure 102 may include a desired quantity of the tiers 108. For example, the stack structure 102 may include greater than or equal to ten (10) of the tiers 108, greater than or equal to twenty-five (25) of the tiers 108, greater than or equal to fifty (50) of the tiers 108, greater than or equal to one hundred (100) of the tiers 108, greater than or equal to one hundred and fifty (150) of the tiers 108, or greater than or equal to two hundred (200) of the tiers 108 of the conductive structures 104 and the insulating structures 106.

The conductive structures 104 of the tiers 108 of the stack structure 102 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 104 are formed of and include W. Each of the conductive structures 104 may individually include a substantially homogeneous distribution of the at least one conductive material, or a substantially heterogeneous distribution of the at least one conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 of each of the tiers 108 of the stack structure 102 exhibits a substantially homogeneous distribution of conductive material. In additional embodiments, at least one of the conductive structures 104 of at least one of the tiers 108 of the stack structure 102 exhibits a substantially heterogeneous distribution of at least one conductive material. The conductive structure 104 may, for example, be formed of and include a stack of at least two different conductive materials. The conductive structures 104 of each of the tiers 108 of the stack structure 102 may each be substantially planar, and may each exhibit a desired thickness.

The insulating structures 106 of the tiers 108 of the stack structure 102 may be formed of and include at least one dielectric material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulating structures 106 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulating structures 106 are formed of and include $SiO_2$. Each of the insulating structures 106 may individually include a substantially homogeneous distribution of the at least one insulating material, or a substantially heterogeneous distribution of the at least one insulating material. In some embodiments, each of the insulating structures 106 of each of the tiers 108 of the stack structure 102 exhibits a substantially homogeneous distribution of insulating material. In additional embodiments, at least one of the insulating structures 106 of at least one of the tiers 108 of the stack structure 102 exhibits a substantially heterogeneous distribution of at least one insulating material. The insulating structure 106 may, for example, be formed of and include a stack (e.g., laminate) of at least two different insulating materials. The insulating structures 106 of each of the tiers 108 of the stack structure 102 may each be substantially planar, and may each individually exhibit a desired thickness.

At least one lower conductive structure 104 of the stack structure 102 may be employed as at least one lower select gate (e.g., at least one source side select gate (SGS)) of the microelectronic device structure 100. In some embodiments, a single (e.g., only one) conductive structure 104 of a vertically lowermost tier 108 of the stack structure 102 is employed as a lower select gate (e.g., a SGS) of the microelectronic device structure 100. In addition, upper conductive structure(s) 104 of the stack structure 102 may be employed as upper select gate(s) (e.g., drain side select gate(s) (SGDs)) of the microelectronic device structure 100. In some embodiments, horizontally-neighboring conductive structures 104 of a vertically uppermost tier 108 of the stack structure 102 are employed as upper select gates (e.g., SGDs) of the microelectronic device structure 100.

With continued reference to FIG. 1A, the microelectronic device structure 100 may further include at least one staircase structure 112 including steps 114 (e.g., contact regions) defined by edges of the tiers 108. The quantity of steps 114 included in the staircase structure 112 may be substantially the same as (e.g., equal to) or may be different than (e.g., less than, greater than) the quantity of tiers 108 in each the stack structure 102. As shown in FIG. 1A, in some embodiments, the steps 114 of the staircase structure 112 are arranged in order, such that steps 114 directly horizontally adjacent one another in the X-direction correspond to tiers 108 of the stack structure 102 directly vertically adjacent (e.g., in the Z-direction) one another. In additional embodiments, the steps 114 of the staircase structure 112 are arranged out of order, such that at least some steps 114 of the staircase structure 112 directly horizontally adjacent one another in the X-direction correspond to tiers 108 of stack structure 102 not directly vertically adjacent (e.g., in the Z-direction) one another.

Referring to FIG. 1B, the stack structure 102 may be partitioned in the Y-direction orthogonal to the X-direction by first slots 142 and second slots 144. In some embodiments, the first slots 142 vertically extend (e.g., in the Z-direction shown in FIG. 1A) deeper into the stack structure 102 than the second slots 144. The first slots 142 may, for example, vertically extend completely through the stack structure 102, and the second slots 144 vertically-extend less than completely through the stack structure 102. The first slots 142 may divide (e.g., in the Y-direction) the stack structure 102 into multiple blocks 103. The first slots 142 may, for example, be employed to form the conductive structures 104 (FIG. 1A) of the stack structure 102 through so-called "replace gate" or "gate last" processing acts, as described in further detail below. The second slots 144 may subdivide (e.g., in the Y-direction) each of the blocks 103 of the stack structure 102 into multiple sub-blocks 105. The first slots 142 may, for example, be employed to further divide at least the uppermost conductive structures 104 (FIG. 1A) of the stack structure 102 so that the uppermost conductive structures 104 may be employed as upper select gates (e.g., SGDs) of the blocks 103 of the stack structure 102.

With returned reference to FIG. 1A, the microelectronic device structure 100 may further include conductive contact structures 116 physically and electrically contacting the steps 114 of the staircase structure 112 to provide electrical access to the conductive structures 104 of the stack structure 102. The conductive contact structures 116 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 116 may have substantially the same material composition, or at least one of the conductive contact structures 116 may have a different material composition than at least one other of the conductive contact structures 116.

At least some of the tiers 108 of the stack structure 102 may be coupled to at least one of the conductive contact structures 116 at one or more of the steps 114 of the staircase structure 112. Referring to FIG. 1B, in some embodiments, at least some of the conductive contact structures 116 on the steps 114 of the staircase structure 112 are horizontally-aligned with one another. For example, as shown in FIG. 1B, at least some (e.g., all) conductive contact structures 116 horizontally-neighboring one another in the X-direction (and, hence, on steps 114 at different vertical positions than one another) may be substantially aligned with one another in the Y-direction. As another example, as also shown in FIG. 1B, at least some (e.g., all) conductive contact structures 116 horizontally-neighboring one another in the Y-direction (and, hence, on steps 114 at substantially the same vertical position as one another) may be substantially aligned with one another in the X-direction.

With returned reference to FIG. 1A, the microelectronic device structure 100 further includes a source tier 118 underlying the stack structure 102, a conductive routing tier 120 (e.g., a metallization tier) underlying the source tier 118, and an conductive interconnect tier 122 between the source tier 118 and the conductive routing tier 120. The conductive interconnect tier 122 and the conductive routing tier 120 may be in electrical communication with portions (e.g., different conductive structures) of the source tier 118, and may electrically connect the portions of the source tier 118 to components of a microelectronic device (e.g., a memory device) including the microelectronic device structure 100, as described in further detail below.

The source tier 118 includes a source structure 124 (e.g., a source plate) and discrete conductive structures 126 (e.g., discrete conductive island structures) horizontally separated (e.g., in the X-direction and in the Y-direction (FIG. 1B) perpendicular to the X-direction) from the source structure 124 and from one another. The source structure 124 and the discrete conductive structures 126 may be located at substantially the same vertical position (e.g., in the Z-direction) within the microelectronic device structure 100 as one another. At least one dielectric material 125 may be horizontally interposed between (e.g., in the X-direction and in the Y-direction (FIG. 1B)) the discrete conductive structures 126 and may also be horizontally interposed between the discrete conductive structures 126 and the source structure 124. Put another way, the dielectric material 125 may horizontally intervene between and separate horizontally-neighboring discrete conductive structures 126 of the source tier 118, and may also horizontally intervene between and separate the source structure 124 and the discrete conductive structures 126 of the source tier 118. The dielectric material 125 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 125 comprises $SiO_2$.

The source structure 124 and the discrete conductive structures 126 may each individually be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the source structure 124 and the discrete conductive structures 126 have substantially the same material composition as one another. Put another way, the source structure 124 and the discrete conductive structures 126 may be formed of and include the same conductive material as one another. For example, the source structure 124 and the discrete conductive structures 126 may be formed (e.g., substantially simultaneously formed) by patterning (e.g., using a predetermined reticle configuration) the conductive material.

The discrete conductive structures 126 of the source tier 118 may include first discrete conductive structures 128 and second discrete conductive structures 130. At least some (e.g., all) of the first discrete conductive structures 128 may located be horizontally proximate and vertically below the conductive contact structures 116 on the steps 114 of the staircase structure 112. For example, as shown in FIG. 1A, the first discrete conductive structures 128 may individually be positioned horizontally between (e.g., in the X-direction) and vertically below (e.g., in the Z-direction) horizontally-neighboring (e.g., in the X-direction) conductive contact structures 116. The first discrete conductive structures 128 may be located within horizontal boundaries of the staircase structure 112, and, optionally, may also be located outside of the horizontal boundaries of the staircase structure 112 (e.g., some of the first discrete conductive structures 128 may be located outside of but proximate to the horizontal boundaries of the staircase structure 112). The second discrete conductive structures 130 and the source structure 124 may be located outside of the horizontal boundaries of the staircase structure 112. As shown in FIG. 1A, in some embodiments, some of the second discrete conductive structures 130 are horizontally interposed between (e.g., in the X-direction) the first discrete conductive structures 128 and the source structure 124.

The discrete conductive structures 126 may each individually exhibit any desired geometric configuration (e.g., dimensions and shape) and spacing. The geometric configurations and spacing of the discrete conductive structures 126 may be selected at least partially based on the configurations and positions of other components of the microelectronic device structure 100. For example, the first discrete conductive structures 128 may be sized, shaped, and positioned based on sizes, shapes, and positions of the steps 114 of the staircase structure 112 and based on sizes, shapes, and positions of the conductive contact structures 116 on the steps 114 of the staircase structure 112 to permit additional conductive structures (e.g., conductive pillar structures) positioned horizontally between (e.g., in the X-direction) the conductive contact structures 116 and vertically-extending (e.g., in the Z-direction) through the stack structure 102 at the staircase structure 112 to physically contact (e.g., land on) the first discrete conductive structures 128, as described in further detail below. In some embodiments, one or more (e.g., each) of the discrete conductive structures 126 exhibits a generally quadrilateral (e.g., generally rectangular, generally square) shape. Each of the discrete conductive structures 126 may exhibit substantially the same geometric configuration (e.g., the same dimensions and the same shape) and horizontal spacing (e.g., in the X-direction) as each other of the discrete conductive structures 126, or at least some of the discrete conductive structures 126 may exhibit a different geometric configuration (e.g., one or more different dimensions, a different shape) and/or different horizontal spacing than at least some other of the discrete conductive structures 126. In some embodiments, the discrete conductive structures 126 are at least partially non-uniformly spaced. For example, as shown in FIG. 1A, at least some horizontally-neighboring first discrete conductive structures 128 may be spaced apart from one another by a different distance than a distance between at least some horizontally-neighboring second discrete conductive structures 130 and/or a distance between the source structure 124 and one or more of the second discrete conductive structures 130 horizontally-neighboring the source structure 124.

With continued reference to FIG. 1A, the source structure 124 and at least some of the discrete conductive structures 126 may be electrically connected to the conductive routing tier 120 and the conductive interconnect tier 122. For example, as shown in FIG. 1A, the source structure 124 and the second discrete conductive structures 130 may be connected (e.g., physically connected, electrically connected) to conductive interconnect structures 132 (e.g., vertically-extending conductive structures) of the conductive interconnect tier 122, and the conductive interconnect structures 132 may be connected (e.g., physically connected, electrically connected) to conductive routing structures 134 (e.g., horizontally-extending conductive structures) of the conductive routing tier 120. In turn, the conductive routing structures 134 of the conductive routing tier 120 may be electrically connected to additional structures and/or devices (e.g., back end of line (BEOL) devices; control logic devices, such as CMOS devices) vertically underlying the microelectronic device structure 100. One or more dielectric materials (e.g., one or more of at least one dielectric oxide material, at least one dielectric nitride material, at least one dielectric oxynitride material, at least one dielectric carboxynitride material, and amorphous carbon) may be horizontally interposed between the conductive interconnect structures 132 of the conductive interconnect tier 122 and between the conductive routing structures 134 of the conductive routing tier 120.

In some embodiments, the first discrete conductive structures 128 are not electrically connected to (e.g., are electrically isolated from) the conductive routing tier 120 and the conductive interconnect tier 122. For example, as shown in FIG. 1A, the first discrete conductive structures 128 may not be electrically connected to conductive interconnect structures 132 within the conductive interconnect tier 122 and conductive routing structures 134 within the conductive routing tier 120. In some embodiments, portions of the conductive interconnect tier 122 and the conductive routing tier 120 vertically underlying and horizontally aligned with the first discrete conductive structures 128 are free of conductive interconnect structures 132 and conductive routing structures 134, respectively. Lower surfaces of the first discrete conductive structures 128 may only be in contact with dielectric material (e.g., $SiO_2$) of the conductive interconnect tier 122. In additional embodiments, the portions of the conductive interconnect tier 122 vertically underlying and horizontally aligned with the first discrete conductive structures 128 include conductive interconnect structures 132 in contact with the first discrete conductive structures 128, but the conductive interconnect structures 132 in contact with the first discrete conductive structures 128 are not in contact with conductive routing structures 134 of the conductive routing tier 120. In further embodiments, the portions of the conductive routing tier 120 vertically underlying and horizontally aligned with the first discrete conductive structures 128 include conductive routing structures 134, but the conductive routing structures 134 are not electrically coupled to the first discrete conductive structures 128 by way of conductive interconnect structures 132 of the conductive interconnect tier 122. In yet further embodiments, the first discrete conductive structures 128 are electrically connected to the conductive routing tier 120 and the conductive interconnect tier 122. For example, the first discrete conductive structures 128 may be connected (e.g., physically connected, electrically connected) to a portion (e.g., a group) of the conductive interconnect structures 132 within the conductive interconnect tier 122, and the portion of the conductive interconnect structures 132 may be connected (e.g., physically connected, electrically connected) to a portion (e.g., a group) of the conductive routing structures 134 within the conductive routing tier 120.

With continued reference to FIG. 1A, the microelectronic device structure 100 further includes conductive pillar structures 136 vertically extending through the stack structure 102 and to the source structure 124 and the discrete conductive structures 126 (including the first discrete conductive structures 128 and the second discrete conductive structures 130 thereof) within the source tier 118. Each of the conductive pillar structures 136 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the conductive pillar structures 136 have substantially the same material composition as one another (e.g., are each formed of and include the same conductive material). In addition, as shown in FIGS. 1A and 1B, at least one dielectric liner material 137 may substantially surround (e.g., substantially horizontally and vertically cover) sidewalls of each of the conductive pillar structures 136. The dielectric liner material 137 may be horizontally interposed between each of the conductive pillar structures 136 and the tiers 108 (FIG. 1A) (including the conductive structures 104 and the insulating structure 106 thereof) of the stack structure 102. The dielectric liner material 137 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric liner material 137 comprises $SiO_2$.

The conductive pillar structures 136 may each individually exhibit any desired geometric configuration (e.g., dimensions and shape) and spacing. The geometric configurations and spacing of the conductive pillar structures 136 may be selected at least partially based on the configurations and positions of other components (e.g., the steps 114 of the staircase structure 112, the conductive contact structures 116, the discrete conductive structures 126, the source structure 124) of the microelectronic device structure 100. For example, the conductive pillar structures 136 may each individually have a geometric configuration and spacing permitting the conductive pillar structure 136 to vertically-extend (e.g., in the Z-direction) through the stack structure 102 and physically contact (e.g., land on) the source structure 124 or one of the discrete conductive structures 126 (e.g., one of the first discrete conductive structures 128, one of the second discrete conductive structures 130) to facilitate a predetermined function (e.g., an electrical interconnection function, a support function) of the conductive pillar structure 136, as described in further detail below. Each of the conductive pillar structures 136 may exhibit substantially the same geometric configuration (e.g., the same dimensions and the same shape) and horizontal spacing (e.g., in the X-direction) as each other of the conductive pillar structures 136, or at least some of the conductive pillar structures 136 may exhibit a different geometric configuration (e.g., one or more different dimensions, a different shape) and/or different horizontal spacing than at least some other of the conductive pillar structures 136. In some embodiments, the conductive pillar structures 136 are at least partially non-uniformly spaced in the X-direction.

As shown in FIG. 1A, the conductive pillar structures 136 may include first conductive pillar structures 138 and second conductive pillar structures 140. The first conductive pillar structures 138 may be located horizontally proximate (e.g., in the X-direction) the conductive contact structures 116 on the steps 114 of the staircase structure 112, and may vertically extend (e.g., in the Z-direction) through the stack structure 102 to the first discrete conductive structures 128 of the source tier 118 underlying the stack structure 102. For example, the first conductive pillar structures 138 may individually be horizontally interposed between (e.g., in the X-direction) horizontally-neighboring (e.g., in the X-direction) conductive contact structures 116, and may individually vertically extend (e.g., in the Z-direction) through the tiers 108 of the stack structure 102 at or horizontally proximate the steps 114 of the staircase structure 112 to the first discrete conductive structures 128 of the source tier 118. In some embodiments, the first conductive pillar structures 138 horizontally alternate with the conductive contact structures 116 in the X-direction. The first conductive pillar structures 138 may be located within horizontal boundaries of the staircase structure 112, and, optionally, may also be located outside the horizontal boundaries of the staircase structure 112 (e.g., some of the first conductive pillar structures 138 may be located outside of but proximate to the horizontal boundaries of the staircase structure 112). The second conductive pillar structures 140 may be located outside of the horizontal boundaries of the staircase structure 112, and may vertically extend (e.g., in the Z-direction) through the stack structure 102 to the source structure 124 and the second discrete conductive structures 130 of the source tier 118 underlying the stack structure 102.

At least some of the conductive pillar structures 136 are horizontally-aligned with one another and the conductive contact structures 116. For example, as referring to FIG. 1B, at least some (e.g., all) first conductive pillar structures 138 horizontally-neighboring one another in the X-direction may be substantially aligned with one another in the Y-direction, and may also may be substantially aligned in the Y-direction with a conductive contact structure 116 horizontally interposed (e.g., in the X-direction) therebetween. As another example, as also shown in FIG. 1B, at least some (e.g., all) conductive contact structures 116 horizontally-neighboring one another in the Y-direction may be substantially aligned with one another in the X-direction.

The first conductive pillar structures 138 may serve as support structures during and/or after the formation of one or more components of the microelectronic device structure 100. For example, the first conductive pillar structures 138 may serve as support structures for the formation of the conductive structures 104 of the tiers 108 of the stack structure 102 using so called "replace gate" or "gate last" processing acts. During replace gate processing, a preliminary stack structure including a vertically alternating (e.g., in the Z-direction) sequence of the insulating structures 106 and sacrificial structures (e.g., additional insulating structures selectively etchable relative to the insulating structures 106, such as dielectric nitride structures if the insulating structures 106 comprise dielectric oxide structures) may be subjected to a material removal process to selectively remove (e.g., selectively exhume) at least a portion (e.g., all, less than all) of each the sacrificial structures relative to the insulating structures 106. Thereafter, open volumes (e.g., void spaces) formed by the removed portions of the sacrificial structures may be filled with a conductive material to form the conductive structures 104. The first conductive pillar structures 138 may impede (e.g., prevent) tier collapse during the selective removal of the sacrificial structures. In addition, the second conductive pillar structures 140 may serve as interconnect structures to electrically couple the source structure 124 and the second discrete conductive structures 130 of the source tier 118 and the additional components connected thereto (e.g., conductive interconnect structures 132 of the conductive interconnect tier 122, conductive routing structures 134 of the conductive routing tier 120, additional structures vertically below the conductive routing tier 120) to other components (e.g., additional structures vertically above the stack structure 102) of a microelectronic device including the microelectronic device structure 100.

The first conductive pillar structures 138 are electrically isolated from the source structure 124 and the second discrete conductive structures 130 of the source tier 118

(e.g., by way of the dielectric material 125). As shown in FIG. 1A, the first conductive pillar structures 138 may also be electrically isolated from the conductive interconnect structures 132 of the conductive interconnect tier 122, the conductive routing structures 134 of the conductive routing tier 120, and any additional structures electrically connected to the conductive routing structures 134 of the conductive routing tier 120. In additional embodiments, one or more of the first conductive pillar structures 138 are electrically connected to one or more of the conductive interconnect structures 132 of the conductive interconnect tier 122, one or more of the conductive routing structures 134 of the conductive routing tier 120, and one or more additional structures electrically connected to the conductive routing structures 134 of the conductive routing tier 120. For example, in additional embodiments, one or more of the first discrete conductive structures 128 connected to one or more the first conductive pillar structures 138 (and, hence, the first conductive pillar structures 138) are electrically connected to one or more of the conductive interconnect structures 132 of the conductive interconnect tier 122, one or more of the conductive routing structures 134 of the conductive routing tier 120, and one or more additional structures electrically connected to the conductive routing structures 134 of the conductive routing tier 120.

With returned reference to FIG. 1A, the electrical isolation of the first discrete conductive structures 128 from the source structure 124, the second discrete conductive structures 130, and one another may prevent undesirable current leakage (e.g., short circuits) and/or damage that may otherwise negatively impact the performance, reliability, and/or durability of a microelectronic device including the microelectronic device structure 100. For example, electrically isolating the first discrete conductive structures 128 prevents current leakage between the source structure 124 (e.g., source plate) and the conductive structures 104 (e.g., WL plates) of the stack structure 102 that may otherwise result from short circuits (e.g., effectuated by insufficient breaking voltage (BV) provided by the dielectric liner material 137 due to formation defects and/or subsequent damage) between the conductive contact structures 116 and the first conductive pillar structures 138 if the first conductive pillar structures 138 were provided on the source structure 124 instead of the first discrete conductive structures 128. In addition, employing the first discrete conductive structures 128 as landing structures for the first conductive pillar structures 138 may also prevent undesirable damage (e.g., corrosion damage) to the source structure 124 that may otherwise occur (e.g., during etching processes used to form openings in a preliminary stack structure to be filled with the first conductive pillar structures 138 and the dielectric liner material 137) if the source structure 124 was employed in place of the first discrete conductive structures 128.

Figure 2:
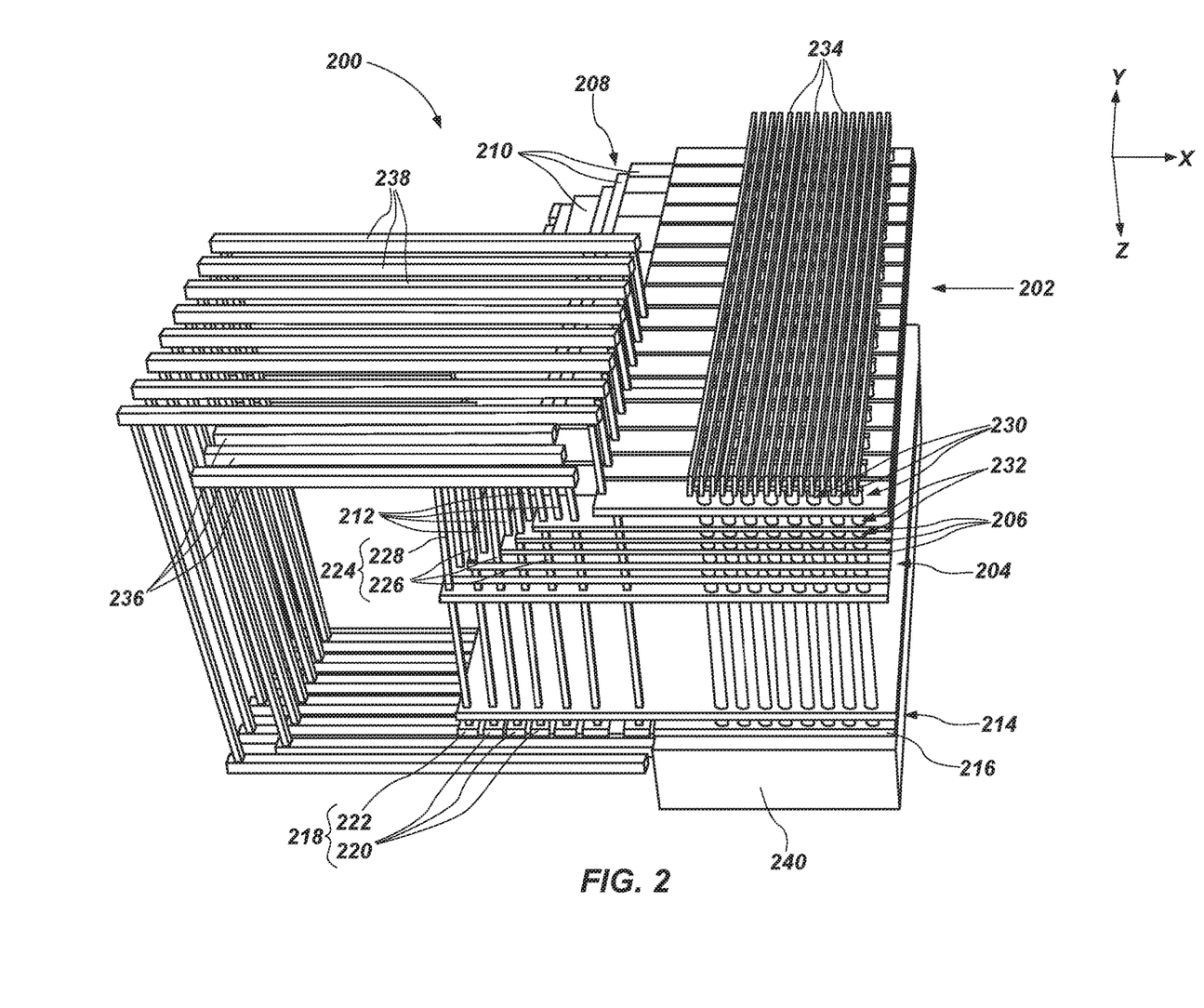
FIG. 2 is a partial cutaway perspective view of a microelectronic device, in accordance with embodiments of the disclosure.

FIG. 2 illustrates a partial cutaway perspective view of a portion of a microelectronic device 200 (e.g., a memory device, such as a dual deck 3D NAND Flash memory device) including a microelectronic device structure 202. The microelectronic device structure 202 may be substantially similar to the microelectronic device structure 100 previously described with reference to FIGS. 1A and 1B. For example, as shown in FIG. 2, the microelectronic device structure 202 may include a stack structure 204 including tiers 206 of conductive structures and insulative structures; a staircase structure 208 having steps 210 defined by edges of the tiers 206; conductive contact structures 212 electrically connected to the steps 210 of the staircase structure 208; a source tier 214 vertically underlying the stack structure 204 and including a source structure 216 and discrete conductive structures 218 (including first discrete conductive structures 220 and second discrete conductive structures 222); and conductive pillar structures 224 vertically extending through the stack structure 204 to the source structure 216 and discrete conductive structures 218 of the source tier 214 (including first conductive pillar structures 226 horizontally proximate the conductive contact structures 212 and on the first discrete conductive structures 220, and second conductive pillar structures 228 on the second discrete conductive structures 222 and the source structure 216). The stack structure 204, the tiers 206, the staircase structure 208, the steps 210, the conductive contact structures 212, the source tier 214, the source structure 216, the discrete conductive structures 218 (including the first discrete conductive structures 220 and the second discrete conductive structures 222), and the conductive pillar structures 224 (including the first conductive pillar structures 226 and the second conductive pillar structures 228) may respectively be substantially similar to the stack structure 102, the tiers 108, the staircase structure 112, the steps 114, the conductive contact structures 116, the source tier 118, the source structure 124, the discrete conductive structures 126 (including the first discrete conductive structures 128 and the second discrete conductive structures 130), and the conductive pillar structures 136 (including the first conductive pillar structures 138 and the second conductive pillar structures 140) previously described with reference to FIGS. 1A and 1B.

As shown in FIG. 2, the microelectronic device 200 may further include strings 230 of memory cells 232 vertically coupled to each other in series, data lines 234 (e.g., bit lines), access lines 236, and select lines 238. The strings 230 of the memory cells 232 extend vertically and orthogonal to conductive lines and tiers (e.g., the data lines 234, the source tier 214, the tiers 206 of the stack structure 204, the access lines 236, the select lines 238) of the microelectronic device 200, and the conductive contact structures 212 may electrically couple components to each other as shown (e.g., the access lines 236 and the select lines 238 to the tiers 206 of the stack structure 204 of the microelectronic device structure 202).

With continued reference to FIG. 2, the microelectronic device 200 may also include a control unit 240 (e.g., a control device) positioned vertically below the strings 230 of memory cells 232, which may include one or more of string driver circuitry, pass gates, circuitry for selecting gates, circuitry for selecting conductive lines (e.g., the data lines 234, the access lines 236, the select lines 238, additional data lines, additional access lines, additional select lines), circuitry for amplifying signals, and circuitry for sensing signals. In some embodiments, the control unit 240 is at least partially (e.g., substantially) positioned within horizontal boundaries (e.g., in the X-direction and the Y-direction) of a horizontal area occupied by the strings 230 of memory cells 232. The control unit 240 may, for example, be electrically coupled to the data lines 234, the source structure 216 of the source tier 214, the access lines 236, and select lines 238. In some embodiments, the control unit 240 includes CMOS (complementary metal-oxide-semiconductor) circuitry. In such embodiments, the control unit 240 may be characterized as having a "CMOS under Array" ("CuA") configuration.

Thus, in accordance with embodiments of the disclosure, a microelectronic device comprises vertically alternating conductive structures and insulating structures arranged in tiers, each of the tiers individually comprising one of the conductive structures and one of the insulating structures; a staircase structure within the stack structure and having steps comprising edges of at least some of the tiers; a source tier underlying the stack structure and comprising: a source structure, and first discrete conductive structures horizontally separated from one another and the source structure by at least one dielectric material; conductive contact structures on the steps of the staircase structure; and first conductive pillar structures horizontally alternating with the conductive contact structures and vertically extending through the stack structure to the first discrete conductive structures of the source tier.

Furthermore, in accordance with additional embodiments of the disclosure, a memory device comprises a stack structure comprising tiers each comprising at least one conductive structure and at least one insulating structure vertically adjacent the at least one conductive structure, a staircase structure having steps comprising horizontal ends of at least some of the tiers, conductive contact structures in physical contact with the steps of the staircase structure, discrete conductive structures underlying the stack structure, conductive pillar structures horizontally interposed between and aligned with the conductive contact structures and vertically extending through the stack structure to the discrete conductive structures, a source plate electrically isolated from and at substantially the same vertical position as the discrete conductive structures; data lines overlying the stack structure, strings of memory cells vertically extending through the stack structure and electrically coupled to the source plate and the data lines, additional conductive lines electrically coupled to the conductive contact structures, and a control device electrically coupled to the source plate, the data lines, and the additional conductive lines.

Moreover, in accordance with further embodiments of the disclosure, a 3D NAND Flash memory device comprises a stack structure, a staircase structure, a source tier, contact structures, support structures, data lines, an array of vertically-extending strings of memory cells, conductive lines, and a control device. The stack structure comprises vertically alternating conductive structures and insulating structures arranged in tiers, each of the tiers individually comprising at least one of the conductive structures and at least one of the insulating structures. The staircase structure has steps comprising edges of at least some of the tiers of the stack structure. The source tier underlies the stack structure and comprises a source plate, and discrete conductive structures horizontally separated from one another and the source plate by a dielectric material. The contact structures are on the steps of the staircase structure. The support structures are horizontally between the contact structures and vertically extends through the stack structure to the discrete conductive structures of the source tier. The data lines overly the stack structure. The array of vertically-extending strings of memory cells extend through the stack structure and are electrically connected to the source plate, and the data lines. The conductive lines are electrically connected to the contact structures. The control device vertically underlies the source tier and is within horizontal boundaries of the array of vertically-extending strings of memory cells, the control device electrically coupled to the source plate, the data lines, and the conductive lines.

Figure 3:
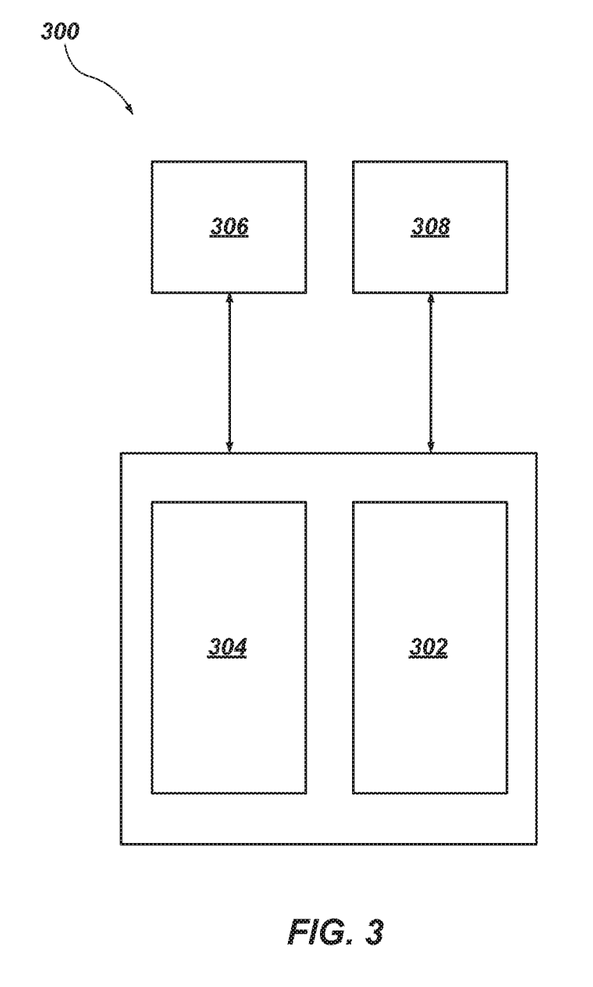
FIG. 3 is a schematic block diagram illustrating an electronic system, in accordance with embodiments of the disclosure.

Microelectronic device structures (e.g., the microelectronic device structure 100 previously described with reference to FIGS. 1A and 1B) and microelectronic devices (e.g., the microelectronic device 200 previously described with reference to FIG. 2) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure (e.g., the microelectronic device structure 100 previously described with reference to FIGS. 1A and 1B) and a microelectronic device (e.g., the microelectronic device 200 previously described with reference to FIG. 2) previously described herein. The electronic system 300 may further include at least one electronic signal processor device 304 (often referred to as a "microprocessor"). The electronic signal processor device 304 may, optionally, include an embodiment of one or more of a microelectronic device structure (e.g., the microelectronic device structure 100 previously described with reference to FIGS. 1A and 1B) and a microelectronic device (e.g., the microelectronic device 200 previously described with reference to FIG. 2). While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 previously described with reference to FIGS. 1A and 1B) and a microelectronic device (e.g., the microelectronic device 200 previously described with reference to FIG. 2) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising an electrically conductive structure and a dielectric structure vertically neighboring the electrically conductive structure; a staircase structure within the stack structure and exhibiting steps comprising edges of at least some of the tiers; a source tier vertically below the stack structure and comprising: a source structure, first discrete conductive structures electrically isolated from one another and the source structure, and second discrete conductive structures horizontally separated from one another, the source structure, and the first discrete conductive structures; conductive contact structures on the steps of the staircase structure; first conductive pillar structures vertically extending through the stack structure at the staircase structure to the first discrete conductive structures of the source tier; and second conductive pillar structures vertically extending through the stack structure to the second discrete conductive structures of the source tier.

The structures (e.g., the microelectronic device structure 100), devices (e.g., the microelectronic device 200), and systems (e.g., the electronic device 300) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the configurations of the source tiers of the disclosure (e.g., the source tier 118 previously described with reference to FIGS. 1A and 1B, including the configurations of the source structure 124, the first discrete conductive structures 128, and the second discrete conductive structures 130 thereof) may reduce the risk of undesirable source-WL current leakage and short circuits as compared to conventional source tier configurations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
  a stack structure comprising vertically alternating conductive structures and insulating structures arranged in tiers, each of the tiers individually comprising one of the conductive structures and one of the insulating structures;
  a staircase structure within the stack structure and having steps comprising edges of at least some of the tiers;
  a source tier underlying the stack structure and comprising:
    a source structure; and
    first discrete conductive structures horizontally separated from one another and the source structure by at least one dielectric material;
  conductive contact structures on the steps of the staircase structure; and
  first conductive pillar structures horizontally alternating with the conductive contact structures and vertically extending through the stack structure to the first discrete conductive structures of the source tier.

2. The microelectronic device of claim 1, wherein the source structure is electronically isolated from each of the first discrete conductive structures.

3. The microelectronic device of claim 1, wherein the source structure and the first discrete conductive structures have substantially the same material composition and vertical position as one another.

4. The microelectronic device of claim 1, further comprising:
  second discrete conductive structures within the source tier and horizontally separated from one another, the first discrete conductive structures, and the source structure by the at least one dielectric material; and
  second conductive pillar structures outside of horizontal boundaries of the staircase structure and vertically extending through the stack structure to the source structure and second discrete conductive structures.

5. The microelectronic device of claim 4, wherein the first conductive pillar structures and the second conductive pillar structures have substantially the same material composition and vertical dimensions as one another.

6. The microelectronic device of claim 4, wherein the source structure and the second discrete conductive structures are electrically connected to additional conductive structures underlying the source tier.

7. The microelectronic device of claim 6, wherein the first discrete conductive structures are electrically isolated from the additional conductive structures.

8. The microelectronic device of claim 1, wherein the first conductive pillar structures each individually physically contact one of the first discrete conductive structures.

9. The microelectronic device of claim 1, wherein the first conductive pillar structures are substantially horizontally aligned with the conductive contact structures.

10. The microelectronic device of claim 1, wherein the conductive structures of the stack structure comprise tungsten.

11. A memory device, comprising:
  a stack structure comprising tiers each comprising at least one conductive structure and at least one insulating structure vertically adjacent the at least one conductive structure;
  a staircase structure having steps comprising horizontal ends of at least some the tiers;
  conductive contact structures in physical contact with the steps of the staircase structure;
  discrete conductive structures underlying the stack structure;
  conductive pillar structures horizontally interposed between and aligned with the conductive contact structures and vertically extending through the stack structure to the discrete conductive structures;
  a source plate electrically isolated from and at substantially the same vertical position as the discrete conductive structures;
  data lines overlying the stack structure;
  strings of memory cells vertically extending through the stack structure and electrically coupled to the source plate and the data lines;
  additional conductive lines electrically coupled to the conductive contact structures; and
  a control device electrically coupled to the source plate, the data lines, and the additional conductive lines.

12. The memory device of claim 11, wherein the discrete conductive structures are each electrically isolated from all other conductive structures underlying the stack structure.

13. The memory device of claim 11, wherein one or more of the discrete conductive structures are electrically connected to one or more additional conductive structures thereunder.

14. The memory device of claim 11, further comprising additional discrete conductive structures horizontally interposed between and at substantially the same vertical position as the source plate and the discrete conductive structures.

15. The memory device of claim 14, wherein one or more of the additional discrete conductive structures are electrically connected to one or more additional conductive structures thereunder.

16. The memory device of claim 15, further comprising additional conductive pillar structures vertically extending through the stack structure to the additional discrete conductive structures.

17. The memory device of claim 11, wherein the control device comprises CMOS circuitry and is at least partially positioned vertically below and within horizontal boundaries of a region of the stack structure containing the strings of memory cells.

18. A 3D NAND Flash memory device, comprising:
- a stack structure comprising vertically alternating conductive structures and insulating structures arranged in tiers, each of the tiers individually comprising at least one of the conductive structures and at least one of the insulating structures;
- a staircase structure having steps comprising edges of at least some of the tiers of the stack structure;
- a source tier underlying the stack structure and comprising:
  - a source plate; and
  - discrete conductive structures horizontally separated from one another and the source plate by a dielectric material;
- contact structures on the steps of the staircase structure;
- support structures horizontally between the contact structures and vertically extending through the stack structure to the discrete conductive structures of the source tier;
- data lines overlying the stack structure;
- an array of vertically-extending strings of memory cells extending through the stack structure and electrically connected to the source plate, and the data lines;
- conductive lines electrically connected to the contact structures; and
- a control device vertically underlying the source tier and within horizontal boundaries of the array of vertically-extending strings of memory cells, the control device electrically coupled to the source plate, the data lines, and the conductive lines.

19. The 3D NAND Flash memory device of claim 18, wherein the control device comprises CMOS circuitry.

20. The 3D NAND Flash memory device of claim 18, wherein the discrete conductive structures and the source plate of the source tier are electrically isolated from one another.

21. The 3D NAND Flash memory device of claim 18, wherein the support structures each individually comprise:
- an electrically conductive pillar structure; and
- a dielectric liner material substantially covering sidewalls of the electrically conductive pillar structure.

22. The 3D NAND Flash memory device of claim 18, wherein the source tier further comprises additional discrete conductive structures horizontally separated from one another, the discrete conductive structures, and the source plate by the dielectric material.

23. The 3D NAND Flash memory device of claim 18, wherein the support structures horizontally alternate with the contact structures and are substantially horizontally aligned with the contact structures.

24. An electronic system, comprising:
- an input device;
- an output device;
- a processor device operably coupled to the input device and the output device; and
- a memory device operably coupled to the processor device and comprising at least one microelectronic device structure comprising:
  - a stack structure comprising tiers each comprising an electrically conductive structure and a dielectric structure vertically neighboring the electrically conductive structure;
  - a staircase structure within the stack structure and exhibiting steps comprising edges of at least some of the tiers;
  - a source tier vertically below the stack structure and comprising:
    - a source structure;
    - first discrete conductive structures electrically isolated from one another and the source structure; and
    - second discrete conductive structures horizontally separated from one another, the source structure, and the first discrete conductive structures;
  - conductive contact structures on the steps of the staircase structure;
  - first conductive pillar structures vertically extending through the stack structure at the staircase structure to the first discrete conductive structures of the source tier; and
  - second conductive pillar structures vertically extending through the stack structure to the second discrete conductive structures of the source tier.

25. The electronic system of claim 24, wherein the memory device comprises a multi-deck 3D NAND Flash memory device.

* * * * *